United States Patent [19]

Shimizu et al.

[11] Patent Number: 4,752,766

[45] Date of Patent: Jun. 21, 1988

[54] ANALOG TO DIGITAL CONVERTER

[75] Inventors: Toshihiko Shimizu, Tokyo; Masao Hotta, Hanno; Kenji Maio, Tokyo, all of Japan

[73] Assignee: Hitachi, Ltd., Tokyo, Japan

[21] Appl. No.: 15,017

[22] Filed: Feb. 17, 1987

[30] Foreign Application Priority Data

Mar. 10, 1986 [JP] Japan .................................. 61-50366

[51] Int. Cl.⁴ .............................................. H03M 1/06
[52] U.S. Cl. ....................... 340/347 AD; 340/347 CC
[58] Field of Search .................. 340/347 AD, 347 CC

[56] References Cited

U.S. PATENT DOCUMENTS 4,400,693 8/1983 Flamm .......................... 340/347 CC Primary Examiner—William M. Shoop, Jr.
Assistant Examiner—Richard K. Blum
Attorney, Agent, or Firm—Antonelli, Terry & Wands

[57] ABSTRACT

In an analog-to-digital converter of a parallel comparison type having a plurality of comparators for comparing an analog input voltage with different reference voltages and converting a comparison result into a digital output by means of an encoder, a plurality of comparators each having a different input dynamic range are used to widen the analog input voltage range up to the power source range of positive and negative voltages.

8 Claims, 7 Drawing Sheets

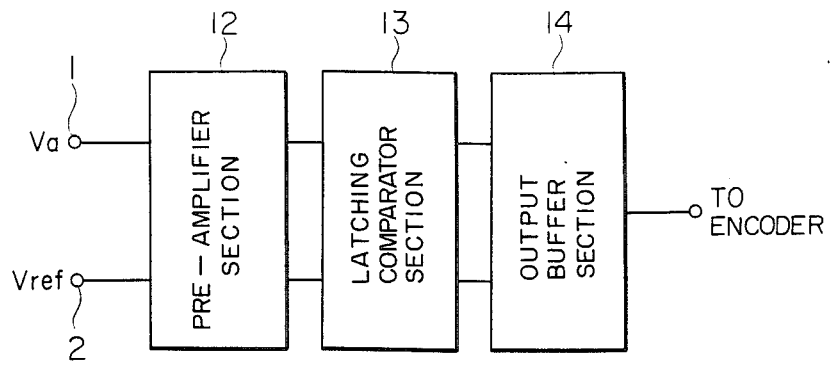
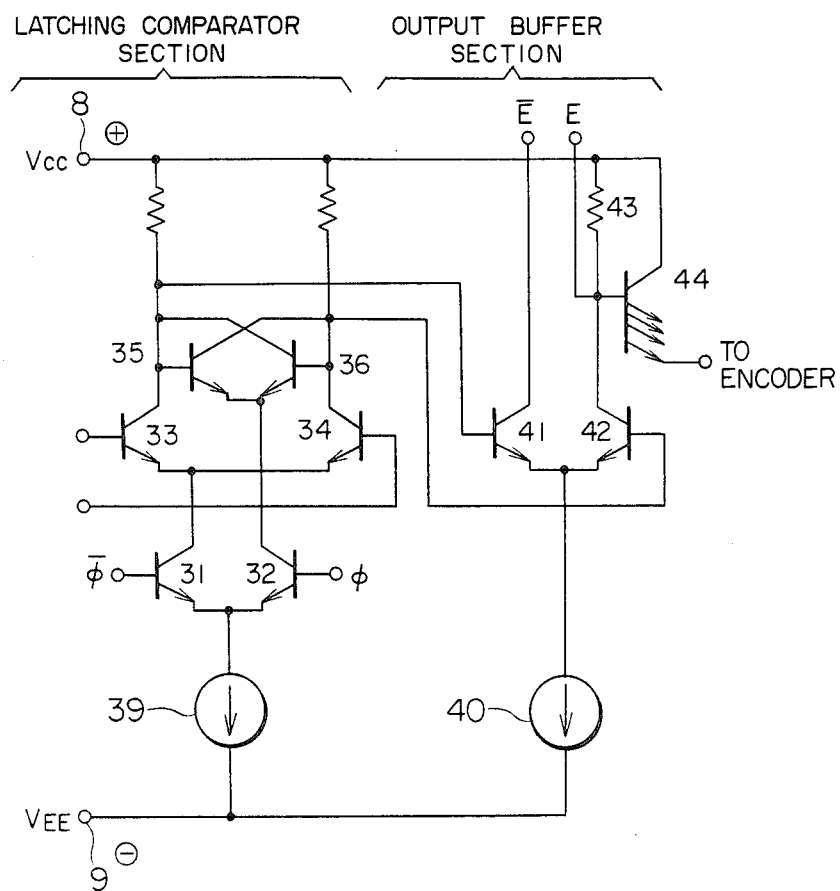

ANALOG TO DIGITAL CONVERTER

BACKGROUND OF THE INVENTION

The present invention relates to an analog-to-digital converter, and more particularly to a parallel analog-to-digital converter capable of operating not only at high speed and with a high resolution but also with wide input dynamic range.

Conventionally, parallel comparison technique has been generally used for analog-to-digital converters processing signals requiring high speed and high precision, such as video signals, because of its high coversion speed, simplicity of circuit integration and unnecessary sample-and-hold circuits. An example of such analog-to-digital circuits is described in the specification of U.S. Pat. No. 4,276,543. Comparators, which determine the performance of an analog-to-digital converter of a parallel comparison type, have been constructed of NPN transistors using electrons as their majority carriers since comparators must process high speed signals. Therefore, the lower limit of an input dynamic range has been a value higher than the negative power source voltage by several times the base-emitter voltage $V_{BE}$. If a 5 V single power source is used, for example, the input dynamic range is in the order of 1 V to 2 V.

SUMMARY OF THE INVENTION

An object of the present invention is to solve the above prior art problem and provide an analog-to-digital converter of a parallel comparison type capable of being driven at a low power supply voltage and having a wide input dynamic range.

To achieve the above object, in an analog-to-digital converter of a parallel comparison type having a plurality of parallel comparator groups for comparing an analog input voltage with reference voltages of a plurality of reference voltage groups and converting a comparison result into a digital output by means of an encoder, two or more comparator groups each having a different input dynamic range are used whereby comparison of the analog input voltage with reference voltages is assigned to each of the two or more comparator groups each having a different reference voltage level. In this manner, the overall dynamic range of the analog-to-digital converter can be widened, and a wide input dynamic range can be obtained even if a small power supply voltage is used.

BRIEF DESCRIPTION OF THE DRAWINGS

FIG. 2 is a block diagram showing a comparator of the first embodiment shown in FIG. 1;

FIG. 3 is a circuit diagram showing the latching comparator section and the output buffer section of a comparator of the embodiment;

DESCRIPTION OF THE PREFERRED EMBODIMENTS

Prior to describing the embodiments of the present invention, a conventional parallel comparison type analog-to-digital converter will be described to aid in understanding the present invention.

Figure 7A:
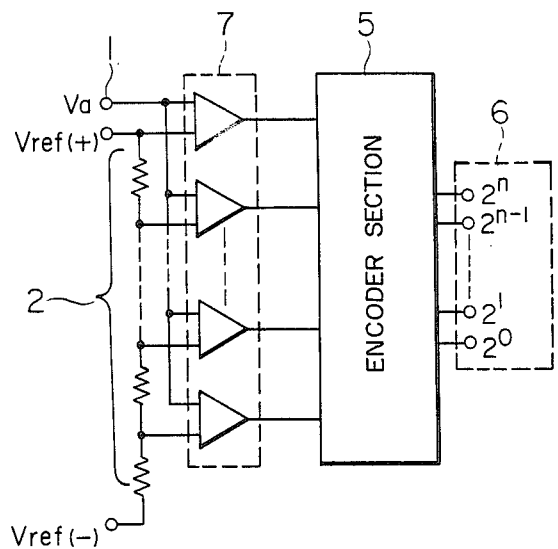
FIG. 7A shows the construction of an analog-to-digital converter according to the prior art.

FIG. 7A shows an analog-to-digital converter having n-bit resolution. A reference voltage generating section 2 is constructed of resistors which divide a voltage between a positive voltage $V_{ref(+)}$ and a negative voltage $V_{ref(-)}$ to produce $2n-1$ reference voltages. An analog voltage $Va$ inputted to terminal 1 is compared with reference voltages supplied to $2n-1$ comparators 7. The outputs of these comparators are converted into a binary digital output 6 by an encoder section 5.

Figure 7B:
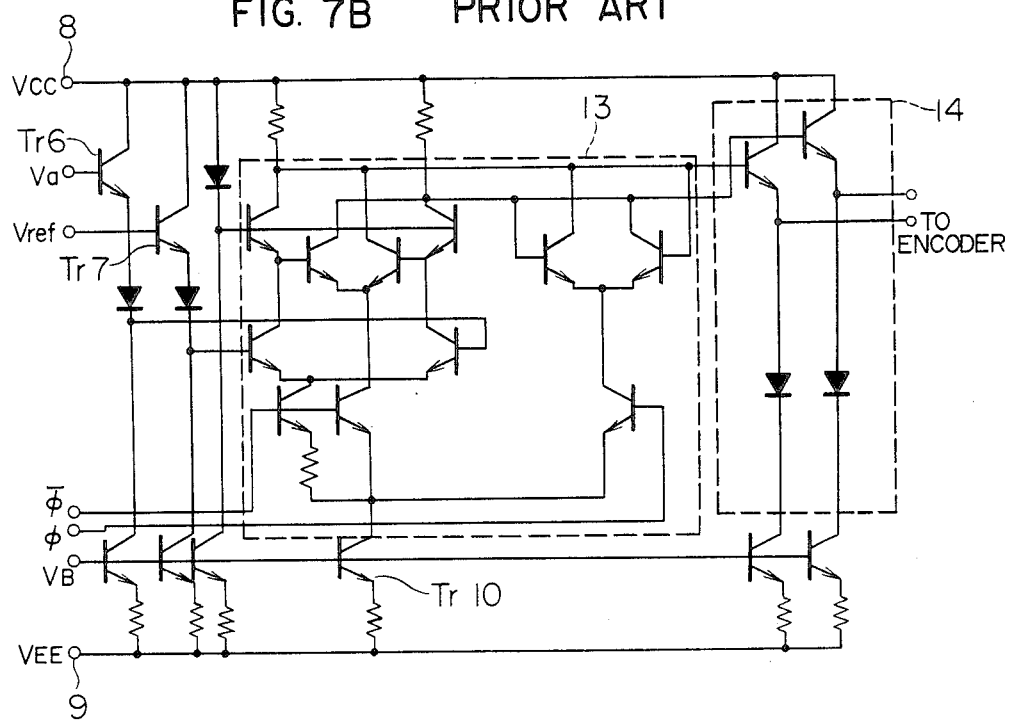
FIG. 7B shows the construction of a comparator of an analog-to-digital converter according to the prior art.

FIG. 7B is a circuit diagram showing one of the comparators 7. An analog input voltage $Va$ and a reference voltage $Vref$ are shifted in level by an emitter follower constructed of NPN transistors $Tr_6$ and $Tr_7$ and compared with each other by a latching comparator 13 of differential arrangement. The comparison result is outputted to an encoder via a buffer amplifier 14. Transistor $Tr_{10}$ constitutes a constant current source for the differential circuit. The lower voltage limit above which the comparator can operate is determined based on the range within which transistor $Tr_{10}$ is not saturated, the lower voltage limit being $(V_{EE}+5 \cdot V_{BE})$, where $V_{BE}$ is a base-emitter voltage of each transistor, and $V_{EE}$ is a negative source voltage. The upper voltage limit below which the comparator can operate is a positive power source voltage $V_{CC}$ supplied to a terminal 8.

The input dynamic range of the comparator shown in FIG. 7B is restricted within a range from $V_{CC}$ to $(V_{EE}+5 \cdot V_{BE})$. The analog-to-digital converter shown in FIG. 7A uses a plurality of comparators of such construction in parallel. Thus, the input dynamic range of the converter equals that of each comparator, resulting in a problem of a narrow input dynamic range as compared with a power source voltage.

The preferred embodiments of the present invention will be described with reference to the accompanying drawings.

Figure 1:
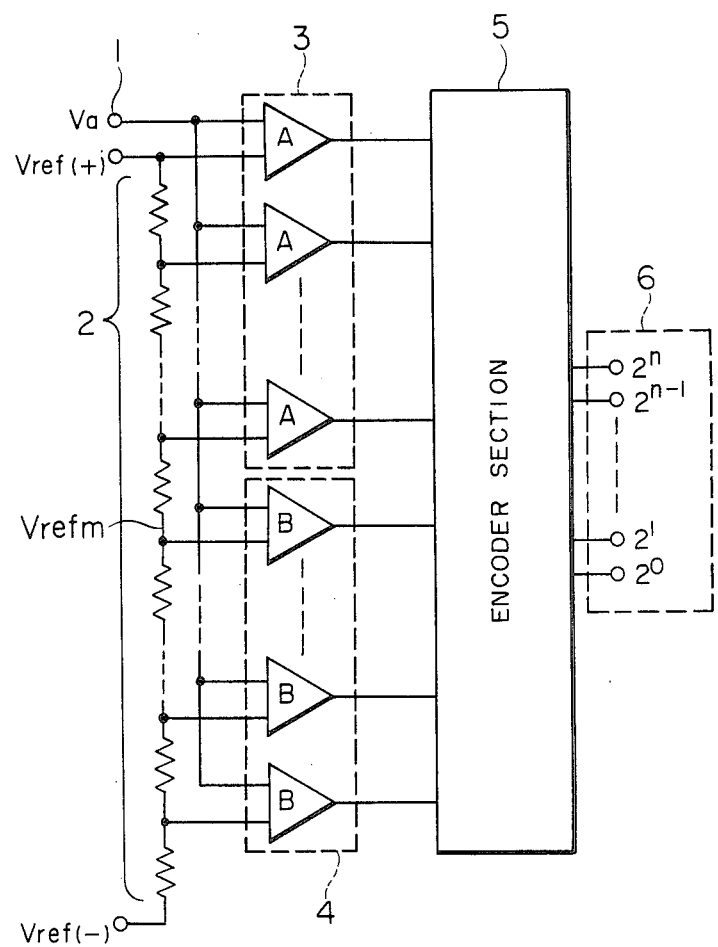
FIG. 1 shows the construction of an analog-to-digital converter according to a first embodiment of the present invention.

FIG. 1 shows, in block form, the construction of an analog-to-digital converter according to a first embodiment of the present invention.

A reference voltage generating section 2 is constructed of resistors at opposite ends of which a maximum reference voltage $V_{ref(+)}$ and a minimum reference voltage $V_{ref(-)}$ are supplied. Division of the voltage between $V_{ref(+)}$ and $V_{ref(-)}$ by the resistors produces a plurality of reference voltages in uniform discrete levels. Those reference voltages higher than a middle reference voltage Vref$_{(m)}$ are supplied to a first comparator group 3. An analog input voltage Va is compared, on one hand, with these "higher" reference voltages by the first comparator group 3, and on the other hand, with "lower" reference voltages between the middle reference voltage Vref$_{(m)}$ and the minimum reference voltage Vref$_{(-)}$ by a second comparator group 4. The comparison result is outputted as a binary digital output 6 from an encoder section 5.

FIG. 2 is a block diagram of a comparator in the comparator groups 3 and 4 shown in FIG. 1.

Each comparator of the comparator group is constructed of a pre-amplifier section 12, a latching comparator section 13, and a buffer section 14. The difference between the first and second comparator groups 3 and 4 resides in the pre-amplifier section as will be described later.

FIG. 3 is a particular circuit diagram showing the latching comparator section and the output buffer section.

A difference between an analog input voltage Va and a reference voltage Vref amplified by the preamplifier section 12, is inputted to a latching comparator section constructed of transistors 31 to 36 and a constant current source 39. In the latching comparator section, a sampling operation and a latching operation are alternately carried out in response to clock signals $\overline{\phi}$ and $\phi$ respectively applied to the bases of transistors 31 and 32. A latched comparison output is supplied to the output buffer section 14.

The output buffer section 14 is constructed of a constant current source 40, transistors 41 and 42 with emitters connected in common, an output multi-emitter transistor 44 and a resistor 43. The output buffer section 14 is a circuit provided for supplying enough sink current and input amplitude to the next stage encoder section 5 and buffering the influence of the encoder section upon the comparison operation of the preceding stage latching comparator section 13 to ensure a reliable comparison operation.

Figure 4A:
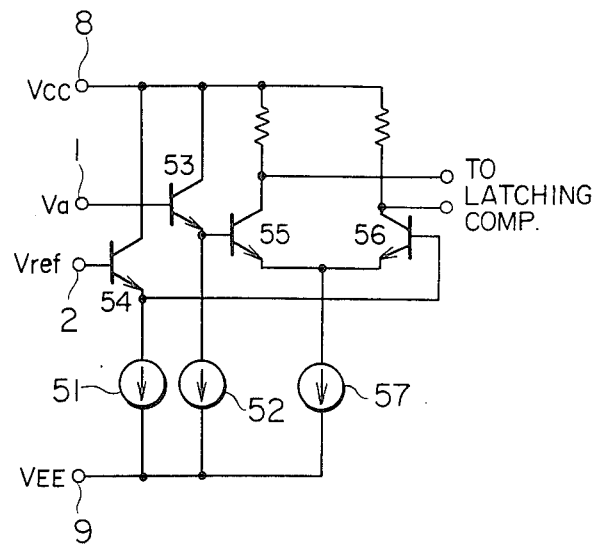
FIG. 4A is a circuit diagram of the pre-amplifier section of a comparator in a first comparator group.

FIG. 4A is a particular circuit diagram of a preamplifier section of a comparator in the first comparator group 3 shown in FIG. 1. An analog input voltage Va applied to input terminal 1 and a reference voltage Vref at terminal 2 are inputted to a differential amplifier constructed of NPN transistors 55 and 56 via emitter followers constructed of NPN transistors 53 and 54. Reference numerals 51, 52 and 57 each denote a constant current source. Assuming that a positive source voltage supplied at terminal 8 is V$_{CC}$ and that a negative source voltage supplied at terminal 9 is V$_{EE}$, the upper limit of a reference voltage becomes V$_{CC}$ below which the comparator using this pre-amplifier section can deliver a comparison output. Further, when both the input analog voltage Va and the reference voltage Vref become lower than a voltage (V$_{EE}$+2.V$_{BE}$+V$_{CE(SAT)}$) where V$_{BE}$ represents a base-emitter voltage of each transistor 53, 54, 55 and 56, a constant current source 57 will be saturated to make the comparator inoperable. Thus, the lower limit of the reference voltage becomes (V$_{EE}$+2.V$_{BE}$+V$_{CE(SAT)}$) where V$_{CE(SAT)}$ represents a saturation voltage of a transistor constituting the constant current source 57. (2.V$_{BE}$+V$_{CE(SAT)}$) is usually about 2 volts. As understood from the above description, the input dynamic range of the first comparator group 3 using pre-amplifiers shown in FIG. 4A is approximately from (V$_{EE}$+2 volts) to V$_{CC}$.

Figure 4B:
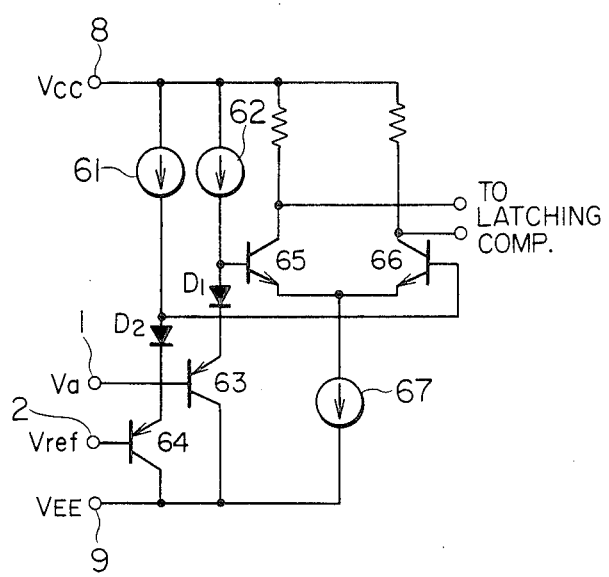
FIG. 4B is a circuit diagram of the pre-amplifier section of a comparator in a second comparator group.

FIG. 4B is a particular circuit diagram of a pre-amplifier section of a comparator belonging to the second comparator group 4.

A PNP transistor 63 and a level shift diode D$_1$ connected to the emitter of the transistor construct an emitter follower with a level shifter which is connected to a current source 62. An analog input voltage Va is inputted to the emitter follower. A reference voltage Vref is inputted to another emitter follower with a level shifter composed of an NPN transistor 64 and a level shift diode D$_2$ which is connected to a current source 61. A differential amplifier constructed of a constant current source 67 and NPN transistors 65 and 66 corresponds to that shown in FIG. 4A. The upper limit of a reference voltage, below which the comparators using this pre-amplifier section can operate is a voltage value obtained by subtracting a positive source voltage V$_{CC}$ by a sum of a voltage drop (V$_{CE(SAT)}$) of the constant current source 61, a voltage drop (V$_{BE}$) of the diode D$_2$, and a voltage drop (also V$_{BE}$) of the transistor 64. Namely, the upper limit is (V$_{CC}$−2.V$_{BE}$−V$_{CE(SAT)}$). On the other hand, the lower limit of a reference voltage is a limit voltage at which the transistor constituting the constant current source 67 does not saturate. In this case, the lower limit becomes (V$_{EE}$+V$_{CE(SAT)}$−V$_{BE}$) which is slightly lower than V$_{EE}$. Thus, the input dynamic range of the second comparator group 4 using pre-amplifiers shown in FIG. 4B becomes from a voltage slightly lower than V$_{EE}$ to (V$_{CC}$−2 volts).

Figure 5:
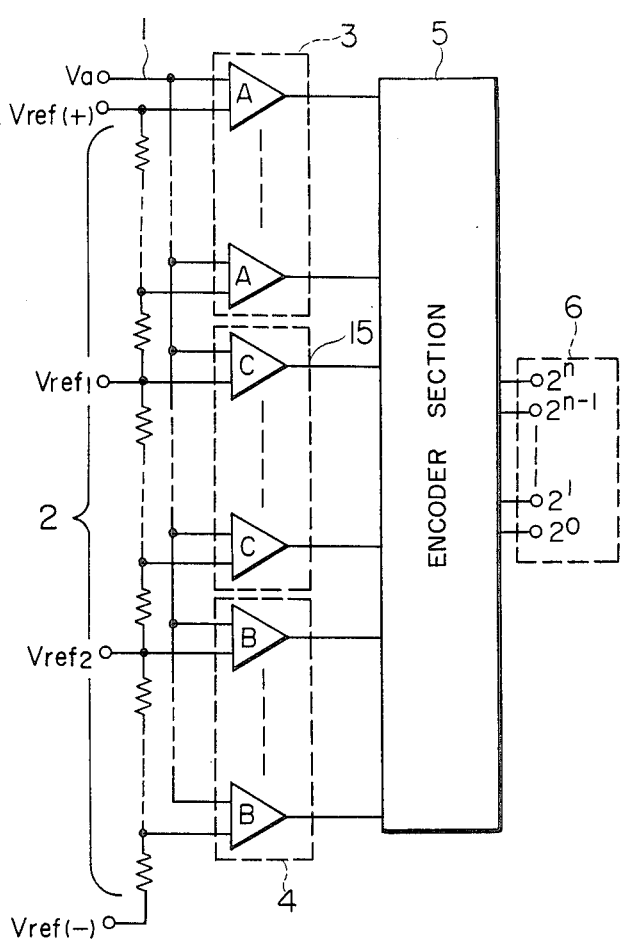
FIG. 5 shows the construction of an analog-to-digital converter according to a second embodiment of the present invention.

In a second embodiment of the present invention shown in FIG. 5, the range of reference voltage, i.e., power source voltage, is covered by three comparator groups including first and second comparator groups 3 and 4 as shown in the first embodiment and a third comparator group 15. The range of reference voltages is divided into three parts which are assigned to the comparator groups 3, 15 and 4, respectively at one third of the range in the order from highest to lowest voltage.

Figure 6:
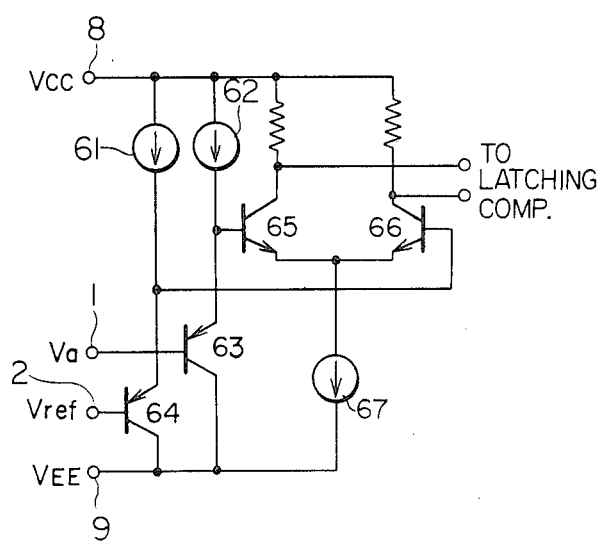
FIG. 6 is a circuit diagram of the pre-amplifier section of a comparator in the third comparator group shown in FIG. 5.

FIG. 6 shows a particular circuit diagram showing an example of a pre-amplifier section of the comparator group 15 of FIG. 5. This circuit differs from the circuit of FIG. 4B used for the second comparator group 4 only in that the level shift diodes D$_1$ and D$_2$ are not used. Consequently, the input dynamic range of the pre-amplifier section is from (V$_{CC}$−V$_{BE}$−V$_{CE(SAT)}$) or about V$_{CC}$−1.2 volt to (V$_{EE}$+V$_{CE(SAT)}$) or about V$_{EE}$+0.4 volt. Use of three types of comparator groups can realize an analog-to-digital converter having a wide input dynamic range covering from V$_{CC}$ to V$_{EE}$ even in the case where a difference between V$_{CC}$ and V$_{EE}$, i.e., a power source voltage, is lower than 4 volts.

Figure 8A:
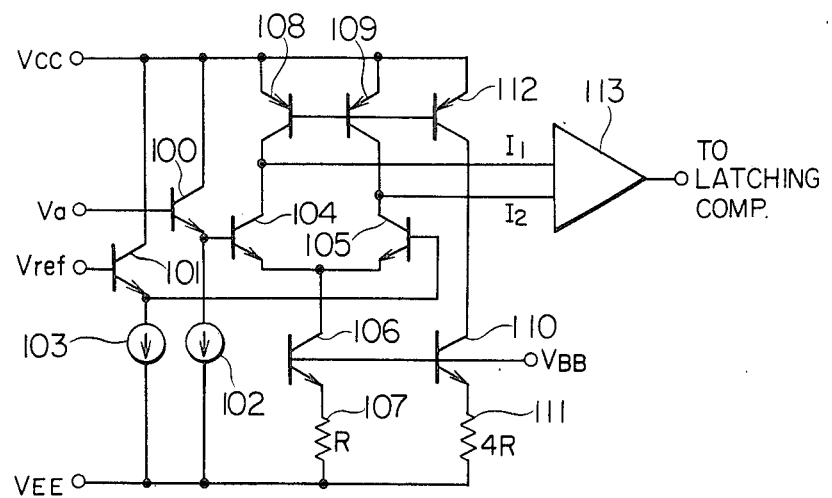
FIGS. 8A and 8B are circuit diagrams showing comparators in first and second comparator groups according to a third embodiment of the present invention.

FIG. 8 shows the construction of two pre-amplifiers of different type used in an analog-to-digital converter according to a third embodiment of the present invention, wherein FIG. 8A corresponds to FIG. 4A of the first embodiment and wherein resistive loads to a differential pair of transistors of FIG. 4A are replaced with active loads of PNP transistors. An analog input voltage Va and a reference voltage Vref are inputted to a differential pair of NPN transistors 104 and 105 via emitter followers constructed of NPN transistors 100 and 101 and constant current sources 102 and 103. The constant current source for the differential pair of NPN transistors 104 and 105 are constructed of an NPN transistor 106 and a resistor 107 (whose resistance value is R), the current passing through the constant current source being 4I. PNP transistors 108 and 109 are used as active loads. By means of a PNP transistor 112 in current Miller relation with the PNP transistors 108 and 109, an NPN transistor 110 in current Miller relation with the constant current source for the differential pair, and a resistor 111 (whose resistance value is 4R), constant current of I flows through each PNP transistor 108 and 109. $V_{BB}$ represents a current Miller bias voltage. Depending on a voltage difference between the analog input voltage Va and the reference voltage Vref, currents passing through the difference pair of NPN transistors 104 and 105 become $2I+\Delta I$ and $2I-\Delta I$, respectively, a difference therebetween being picked up as output currents $I_1$ and $I_2$ which are $I+\Delta I$ and $I-\Delta I$, respectively. This current is converted into voltage by a current detecting type amplifier 113. And then, the voltage is inputted to the next stage latching comparator 13. The comparator group using pre-amplifier sections of this type is used as the first comparator group 3 shown in FIG. 1.

Figure 8B:
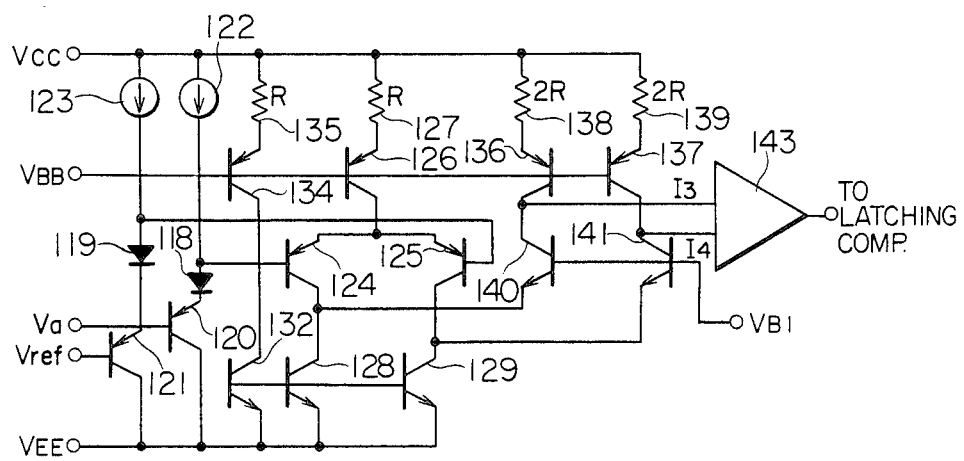

Similarly, FIG. 8B shows the construction of a pre-amplifier section used in the second comparator group 4. First, an analog input voltage Va and a reference voltage Vref are inputted to emitter followers constructed of PNP transistors 120 and 121, diodes 118 and 119, and constant current sources 122 and 123. The outputs from the emitter followers are inputted to a differential pair of PNP transistors 124 and 125. By means of an NPN transistor 132 in current Miller relation with NPN transistors 128 and 129 of active load, a PNP transistor 134 and a resistor 135, a same current I' as that of a constant current source (constructed of a PNP transistor 126 and a resistor 127 and having a current value of I') flows respectively through the active loads 128 and 129. The collectors of the differential pair of PNP transistors 124 and 125 are respectively connected to level shift circuits constructed of NPN transistors 140 and 141 and constant current sources of current Miller configuration (constructed of PNP transistors 136 and 137 and resistors 138 and 139 of 2R, and having a current of I'/2). Thus, a current difference generated at the differential pair of PNP transistors 124 and 125 appears as a current difference flowing through NPN transistors 140 and 141, which in turn appears in output currents $I_3$ and $I_4$. Similar to the case of FIG. 8A, the current difference is converted into voltage by a current detecting type amplifier 143. And then the voltage is imputted a latching comparator 13. $V_{B1}$ represents a fixed voltage.

Use of both PNP and NPN type transistors at the input stage similar to the first embodiment and use of transistor active loads allow a high output impedance which leads to a large gain even at a low operating current and hence a low power consumption.

Figure 9A:
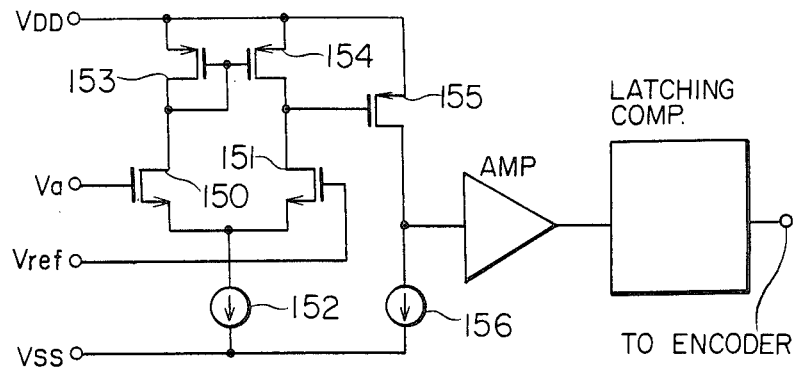
FIGS. 9A and 9B are circuit diagrams showing comparators in first and second comparator groups according to a fourth embodiment of the present invention.

FIG. 9 shows the construction of a pre-amplifier section and a latching comparator section both using CMOS's, of an analog-to-digital converter according to a fourth embodiment. The construction of FIG. 9A includes a pre-amplifier section, the next stage amplifier and a latching comparator section. The pre-amplifier section is constructed of a differential amplifier and a single-ended PMOS output stage, the differential amplifier being constructed of a differential pair of NMOS's 150 and 151, PMOS acitve loads 153 and 154, and a constant current source 152. The upper limit of the input dynamic range of the pre-amplifier section is $V_{DD}+V_{TH1}$, and the lower limit is $V_{SS}+V_{TH2}+V_{TH3}$. $V_{TH1}$ represents a threshold voltage ($V_{TH1}<0$) of an active load PMOS, $V_{TH2}$ represents that ($V_{TH2}>0$) of the NMOS differential pair, and $V_{TH3}$ represents that ($V_{TH3}>0$) of an NMOS constituting the constant current source. To set the upper limit to $V_{DD}$, NMOS source followers are added at the preceding stage of the differential pair, in the similar manner as in the embodiments described previously.

Figure 9B:
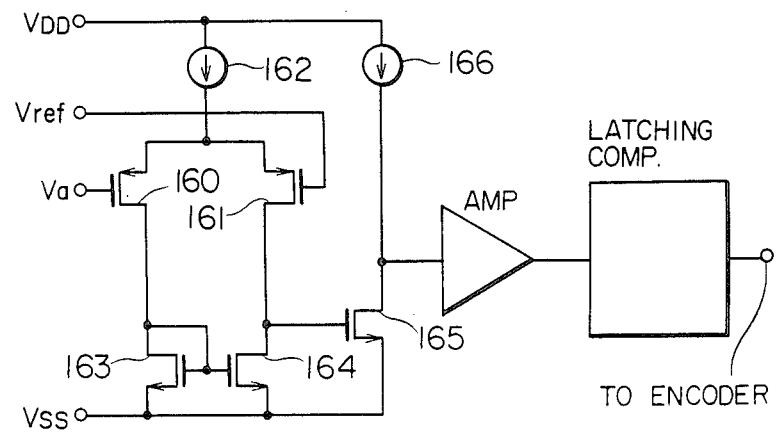

The construction of FIG. 9B is obtained by reversing PMOS's and NMOS's in FIG. 9A. Therefore, the lower limit of an input dynamic range becomes $V_{SS}+V_{TH1}$, and the upper limit becomes $V_{DD}+V_{TH2}+V_{TH3}$. Similarly, to set the lower limit of the input dynamic range down to $V_{SS}$, PMOS source followers are added at the preceding stage of the differential pair. Applying the circuit of FIG. 9A to the first comparator group 3 of FIG. 1 and the circuit of FIG. 9B to the second comparator group 4, it is possible to realize a CMOS analog-to-digital coverter having an input dynamic range from $V_{DD}$ to $V_{SS}$ of the power source voltage. In addition, use of CMOS's enables a low power consumption and a high input impedance.

We claim:

1. A parallel comparison type analog-to-digital converter comprising:
    a group of resistors each of which is connected in series for dividing a voltage applied across both end terminals of said group of resistors to generate a plurality of reference voltages;
    a plurality of comparators for comparing an analog input voltage with each of said reference voltages; and
    an encoder for converting the outputs from said plurality of comparators into a digital output,
    wherein said plurality of comparators are divided into at least two groups based on the level of the inputted reference voltages to be compared with said analog input voltage, such that a first group of said plurality of comparators which correspond to a first level of reference voltages have a wider voltage dynamic range than a second group of said plurality of comparators, said second level of reference voltages being lower than said first level of reference voltages.

2. An analog-to-digital converter according to claim 1, wherein each comparator in said comparator group comprises a latching comparator section whose sampling operation and latching operation are switched in response to a clock signal supplied thereto, said latching comparator being provided at a preceding stage with a pre-amplifier section.

3. An analog-to-digital converter according to claim 2, wherein said pre-amplifier section of said comparator comprises an emitter follower stage for shifting a level of said analog input and a differential amplifier stage connected thereto.

4. An analog-to-digital converter according to claim 3, wherein said emitter follower stage of said pre-amplifier section of at least one comparator of said plurality of comparator groups comprises an emitter follower including an NPN transistor and a current source connected to said emitter follower.

5. An analog-to-digital converter according to claim 4, wherein said current source is a constant current source including an NPN transistor and a resistor.

6. An analog-to-digital converter according to claim 3, wherein said emitter follower stage of said pre-amplifier section of at least one comparator of said plurality of comparator groups comprises an emitter follower made of a PNP transistor and a current source connected to the emitter of said emitter follower.

7. An analog-to-digital converter according to claim 3, wherein said emitter follower stage of said preamplifier section of at least one comparator of said plurality of comparator groups comprises an emitter follower and a plurality of diodes connected to the emitter of said emitter follower.

8. An analog-to-digital converter according to claim 6, wherein said current source is a constant current source including a PNP transistor and a resistor.

* * * * *